(12) United States Patent
Mann et al.

(10) Patent No.: US 7,221,516 B2
(45) Date of Patent: May 22, 2007

(54) PROJECTION LENS FOR A MICROLITHOGRAPHIC PROJECTION EXPOSURE APPARATUS

(75) Inventors: Hans-Jürgen Mann, Oberkochen (DE); Wolfgang Singer, Aalen (DE)

(73) Assignee: Carl Zeiss SMT AG (DE)

( * ) Notice: Subject to any disclaimer, the term of this patent is extended or adjusted under 35 U.S.C. 154(b) by 0 days.

(21) Appl. No.: 11/133,531

(22) Filed: May 20, 2005

(65) Prior Publication Data
US 2005/0264787 A1    Dec. 1, 2005

Related U.S. Application Data

(63) Continuation of application No. PCT/EP2002/014620, filed on Dec. 20, 2002.

(30) Foreign Application Priority Data
Nov. 21, 2002 (DE) ................................ 102 54 310

(51) Int. Cl.
*G02B 3/00* (2006.01)
*G02B 9/00* (2006.01)
*G03B 27/54* (2006.01)

(52) U.S. Cl. .............. 359/649; 359/739; 359/740; 355/67; 355/71; 355/53

(58) Field of Classification Search ........ 359/649–651, 359/739–740; 355/67, 71, 53
See application file for complete search history.

(56) References Cited

U.S. PATENT DOCUMENTS 6,445,442 B2 *  9/2002  Von Bunau et al. .......... 355/67
2004/0057134 A1   3/2004  Dinger

FOREIGN PATENT DOCUMENTS

| EP | 1093021 A2 | 4/2001 |
| FR | 2774481 A1 | 6/1999 |
| JP | 58125033 A | 7/1983 |

* cited by examiner

*Primary Examiner*—Evelyn A. Lester
(74) *Attorney, Agent, or Firm*—Young Basile

(57) ABSTRACT

A projection lens for a EUV microlithographic projection exposure apparatus comprises a diaphragm (BL) which is arranged at a distance (D) in front of a mirror (S2) of the lens. The diaphragm (BL) has a non-round aperture with an edge contour that may be configured such two rays of a light bundle disposed symmetrically with respect to a chief ray are treated equally, i.e. either both rays pass through the diaphragm aperture or both are blocked by the diaphragm.

21 Claims, 7 Drawing Sheets

PROJECTION LENS FOR A MICROLITHOGRAPHIC PROJECTION EXPOSURE APPARATUS

CROSS-REFERENCE TO RELATED APPLICATIONS

This application is a continuation of International Application PCT/EP2002/014620, which has an international filing date of Dec. 20, 2002 and claims priority of German patent application DE 102 54 310. The full disclosure of these earlier applications is incorporated herein by reference.

BACKGROUND OF THE INVENTION

1. Field of the Invention

The invention relates to a projection lens for a microlithographic projection exposure apparatus, and in particular for a projection exposure apparatus designed for projection light in the short-wave UV and EUV range.

2. Description of Related Art

In microlithography projection lenses with mirrors as imaging components are used for projection light in the short-wave UV and EUV ranges. For example, EP 1 178 356 A2 discloses a projection lens for microlithography which has six coaxial mirrors. This known projection lens has a diaphragm which is arranged on the second of the six mirrors of the lens.

Because the diaphragm is combined with one of the mirrors it is possible to change the diaphragm aperture only with great difficulty. The whole mirror supporting the diaphragm must be removed and replaced by an optically equivalent mirror supporting another diaphragm. This means that the lens must be readjusted, and care must be taken to close the lens again in a vacuum-tight manner and to re-evacuate the lens.

SUMMARY OF THE INVENTION

It is therefore an object of the present invention to improve a projection lens a microlithographic projection exposure apparatus in such a way that the diaphragm aperture can be changed in a simpler manner.

This object is achieved by a projection lens comprising:
a mirror on which a chief ray of a light bundle falls obliquely with respect to a mirror axis,
a diaphragm arranged at a distance in front of the mirror, said diaphragm having a diaphragm aperture with a non-round edge contour for controlling a light flux impinging on and reflected from the mirror.

Preferably the edge contour of the diaphragm aperture is configured such that two rays of the light bundle disposed symmetrically with respect to the chief ray are treated equally, i.e. either both rays pass through the diaphragm aperture or both are blocked by the diaphragm.

In the projection lens according to the invention the diaphragm is spatially separated from the mirror with which it is associated. It can therefore be exchanged separately without the optical beam path being influenced by the exchange. Changing of the diaphragm aperture therefore does not necessitate any adjustment work on the imaging components of the lens.

The spatial separation of the diaphragm from the associated mirror of the projection lens is also advantageous in view of the fact that the area of the diaphragm surrounding the aperture is heated by incident radiation. If this heat is transmitted to the mirror temperature-induced imaging errors can occur. In the projection lens according to the invention, the material of the diaphragm and the diaphragm mounting can be selected such that a good dissipation of heat away from the diaphragm is ensured.

However, the arrangement of the diaphragm at a distance in front of the associated mirror would in itself incur the disadvantage that vignetting of the image produced by the projection lens would be obtained. Such vignetting is avoided according to the invention in that the diaphragm aperture has a particular non-round edge contour which ensures that two rays disposed at equal distances from the chief ray are treated in the same way by the diaphragm. For a point at the centre of the object field this means that two rays disposed at equal distances from the chief ray either are both allowed to pass or are both blocked.

The invention therefore provides a projection lens in which, firstly, the diaphragm aperture is easily adjustable and, secondly, no vignetting of the image produced is obtained.

According to an advantageous embodiment of the invention the non-roundness of the diaphragm aperture depends on the distance between the above-mentioned mirror and the diaphragm.

In this way allowance is made for the offset of the reflected beam in a plane of the diaphragm located at a distance from the mirror.

According to another advantageous embodiment of the invention the non-roundness of the diaphragm aperture depends on the angle included between the axis of the chief ray and the axis of the mirror.

In this way allowance is made for the influence of the angle of inclination of the beam path with respect to the optical axis of the mirror.

According to another advantageous embodiment of the invention the edge contour of the diaphragm aperture is selected as a function of the edge contour of the object field.

By this means the symmetrical treatment of rays parallel to the chief ray referred to above is ensured for the different chief rays corresponding to the illuminated area of a pattern object (e.g. a reticle).

According to another advantageous embodiment of the invention the edge contour of the diaphragm aperture is substantially symmetrical with respect to an axis parallel to the direction of scanning.

This is advantageous with regard to simple manufacture of the aperture in the diaphragm.

According to another advantageous embodiment of the invention the edge contour of the diaphragm aperture is substantially symmetrical to an axis perpendicular to the direction of scanning.

This is advantageous with regard to simple manufacture of the diaphragm.

According to another advantageous embodiment of the invention the edge contour of the aperture corresponds to the envelope curve of two overlapping ellipses.

While such a configuration of the diaphragm aperture provides very good conformation to an ideal form the geometry of the diaphragm aperture nevertheless remains simple, so that the diaphragm aperture can be easily manufactured.

According to another advantageous embodiment of the invention the edge contour of the diaphragm aperture is substantially an ellipse.

Such a geometry of the diaphragm aperture is a good compromise between ideal diaphragm aperture geometry and simplicity in manufacturing the diaphragm aperture.

According to another advantageous embodiment of the invention the centre of the diaphragm aperture is disposed at a distance from a common axis of the mirrors.

This allows for the fact that in a projection lens having a plurality of coaxial mirrors the mirrors are illuminated by the light only in partial areas.

According to another advantageous embodiment of the invention the diaphragm is arranged detachably in front of the above-mentioned mirror.

It is thereby achieved that the diaphragm can be simply exchanged for a diaphragm having a different aperture.

According to another advantageous embodiment of the invention a set of diaphragms is provided having differing edge contours and/or apertures of differing areas.

This makes it possible to make available from a set of different diaphragms an aperture which is suitable for the particular case in a short-tern manner, e.g. by using a changing device similar to that known as a CD changer.

According to another advantageous embodiment of the invention a plurality of diaphragm apertures, which differ with respect to the geometry of their edge contours and/or their areas, are formed in one movable diaphragm body.

This makes it possible to replace one diaphragm aperture by an aperture of different geometry and/or cross-sectional area without opening the projection lens.

According to another advantageous embodiment of the invention the diaphragm aperture is adjustable.

This makes it possible to adjust the size of a diaphragm aperture to the particular requirements in an ad hoc manner.

According to another advantageous embodiment of the invention the diaphragm has two sets of diaphragm rods arranged parallel and displaceably towards one another on each side of a center plane.

This makes it possible to approximate to any edge contours of the diaphragm aperture by means of a stepped curve. Such a diaphragm is universally adjustable. Even if the cross-sectional geometry of the light field is considerably altered the projection lens according to this refinement can continue to be used without intervention; it is necessary only to reposition the adjustable diaphragm elements according to the desired area of the diaphragm aperture and/or to a different cross-sectional geometry of the object field.

According to another advantageous embodiment of the invention the aperture rods have a rectangular or square transverse cross-section.

It is thereby achieved that the diaphragm rods can occlude the entire diaphragm aperture in a light-tight manner in desired areas. In addition, good guidance of the diaphragm rods on all sides is achieved by means of adjacent side faces of adjacent diaphragm rods and guide faces of a diaphragm frame.

According to another advantageous embodiment of the invention the diaphragm rods have in each case a transverse actuating pin and the actuating pins of a set of diaphragm bodies are in each case received displaceably in a positioning fork, which positioning forks are in their turn displaceable in a direction parallel to the longitudinal direction of the diaphragm rods.

This mode of adjustment of the diaphragm rods makes it possible to execute successively the different settings of the different diaphragm rods using a single coordinate drive system.

According to another advantageous embodiment of the invention the two positioning forks co-operating with the two sets of diaphragm rods are positively coupled together to execute equal and opposed movements.

In this way it is achieved that diaphragm apertures disposed symmetrically with respect to the centre plane of the diaphragm can be realized in a mechanical fashion which is especially simple with regard to its means of control.

According to another advantageous embodiment of the invention the positioning forks are movable perpendicularly to the longitudinal direction of the diaphragm rods in the plane defined by the diaphragm rods.

In this way it is ensured that the positioning forks can release the actuating pins of the different diaphragm rods successively.

According to another advantageous embodiment of the invention a control unit is provided which alternatingly controls the motion of servomotors which act on the positioning forks in both their directions of adjustment.

Such a control system ensures in a simple manner that the positioning of the diaphragm rods and the releasing of the diaphragm rods take place in successive time periods.

According to another advantageous embodiment of the invention the adjacent side faces of the diaphragm rods run against one another with low friction.

It is thereby ensured that adjustment of one diaphragm rod does not cause a positional change of an adjacent diaphragm rod.

According to another advantageous embodiment of the invention at least one of the bounding faces of the diaphragm rods disposed parallel to the plane of movement of the diaphragm rods co-operates with a friction face.

It is thereby ensured that after the diaphragm rods have been set to the desired position and released by the positioning forks the diaphragm rods remain in the position once set.

According to another advantageous embodiment of the invention means are provided for resiliently pressing the friction face against the above-mentioned bounding faces of the diaphragm rods disposed parallel to the plane of movement.

In this way it is ensured that the braking force acting on the diaphragm rods is provided independently of temperature changes.

According to another advantageous embodiment of the invention a resilient friction lining co-operating with the diaphragm rods is provided.

It is thereby achieved that the desired frictional force on the diaphragm rods is ensured independently of minor manufacturing tolerances.

BRIEF DESCRIPTION OF THE DRAWINGS

Various features and advantages of the present invention may be more readily understood with reference to the following detailed description taken in conjunction with the accompanying drawing in which.

DESCRIPTION OF PREFERRED EMBODIMENTS

Figure 1:
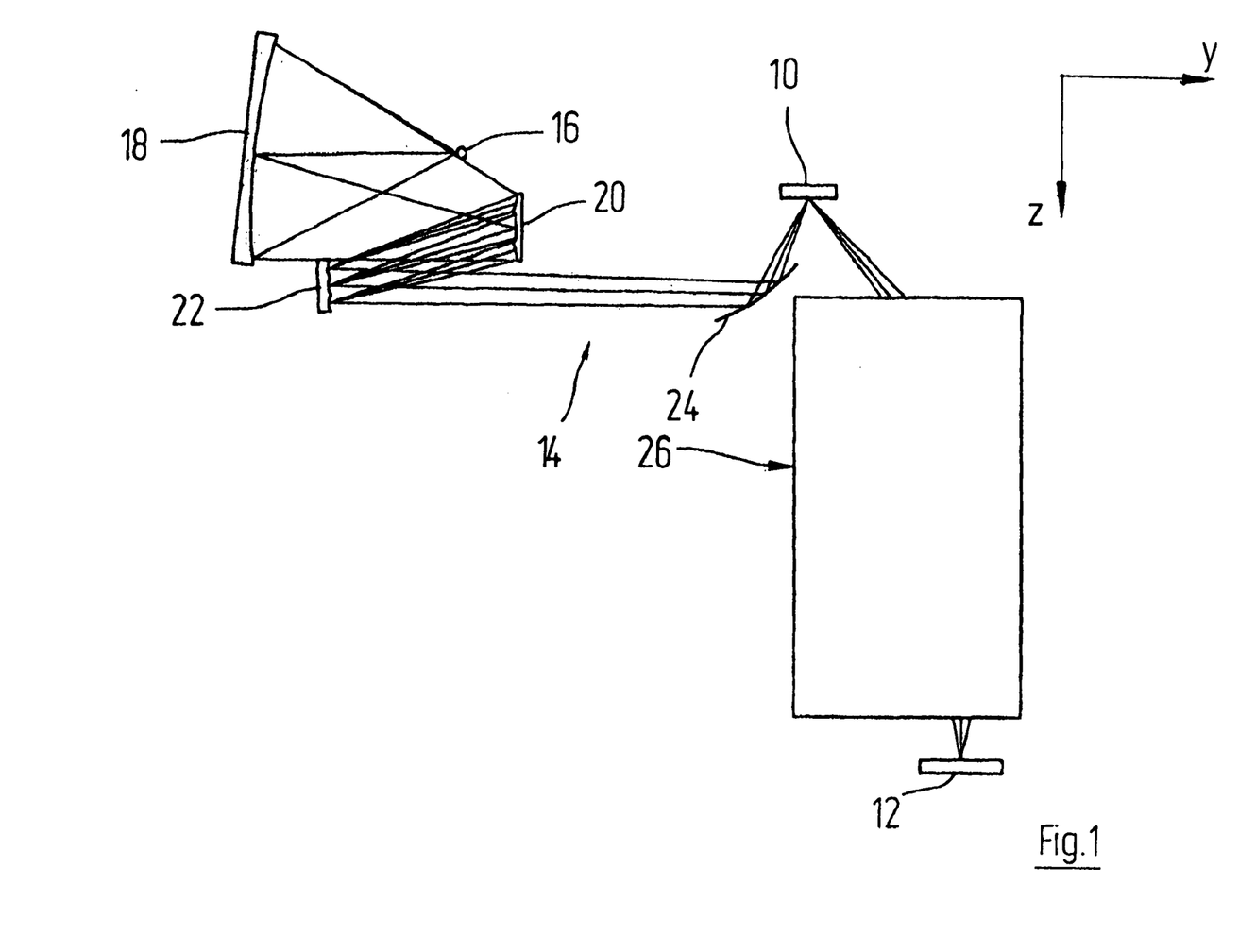
FIG. 1 is a schematic representation of a projection exposure apparatus as used in the manufacture of semiconductor chips.

FIG. 1 shows schematically a projection exposure apparatus which is used to produce an image of a pattern contained in a reticle 10 on a light-sensitive layer supported by a wafer 12.

In the following description a cartesian system of coordinates x, y, z, which is also shown in the figures, is used to indicate directions and extensions. The z-axis of this coordinates system is perpendicular to the plane of the reticle 10 and the plane of the wafer 12. The y-direction of the coordinates system runs in the horizontal direction of FIG. 1 (scanning direction or direction of movement of the reticle 10), and the x-direction is perpendicular to the two z and y directions and therefore runs rearwardly, perpendicularly to the plane of projection of FIG. 1.

When this system of coordinates is used at other points in the beam path the axes should be imagined as displaced in a parallel, analogous manner.

The illumination of the reticle 10 is effected by the use of an illumination system, denoted as a whole by reference numeral 14, which includes an EUV light source 16, a collector mirror 18, two raster element mirrors 20, 22 and a focusing mirror 24.

The total illumination system is so designed that it generates on the downwardly oriented face of the reticle 10 in FIG. 1 a light patch in the form of a ring segment which defines the object field.

By moving the reticle 10 in the horizontal direction (y-direction) of FIG. 1 its underside, carrying the pattern to be projected, is scanned.

The light reflected by the reticle 10 is imaged on the upper face of the wafer 12 by means of a projection lens 26, which is only schematically represented in FIG. 1. While allowing for the imaging scale of the projection lens 26 the wafer 12 is moved synchronously with the reticle 10 in the horizontal direction (y-direction) of FIG. 1.

Figure 2:
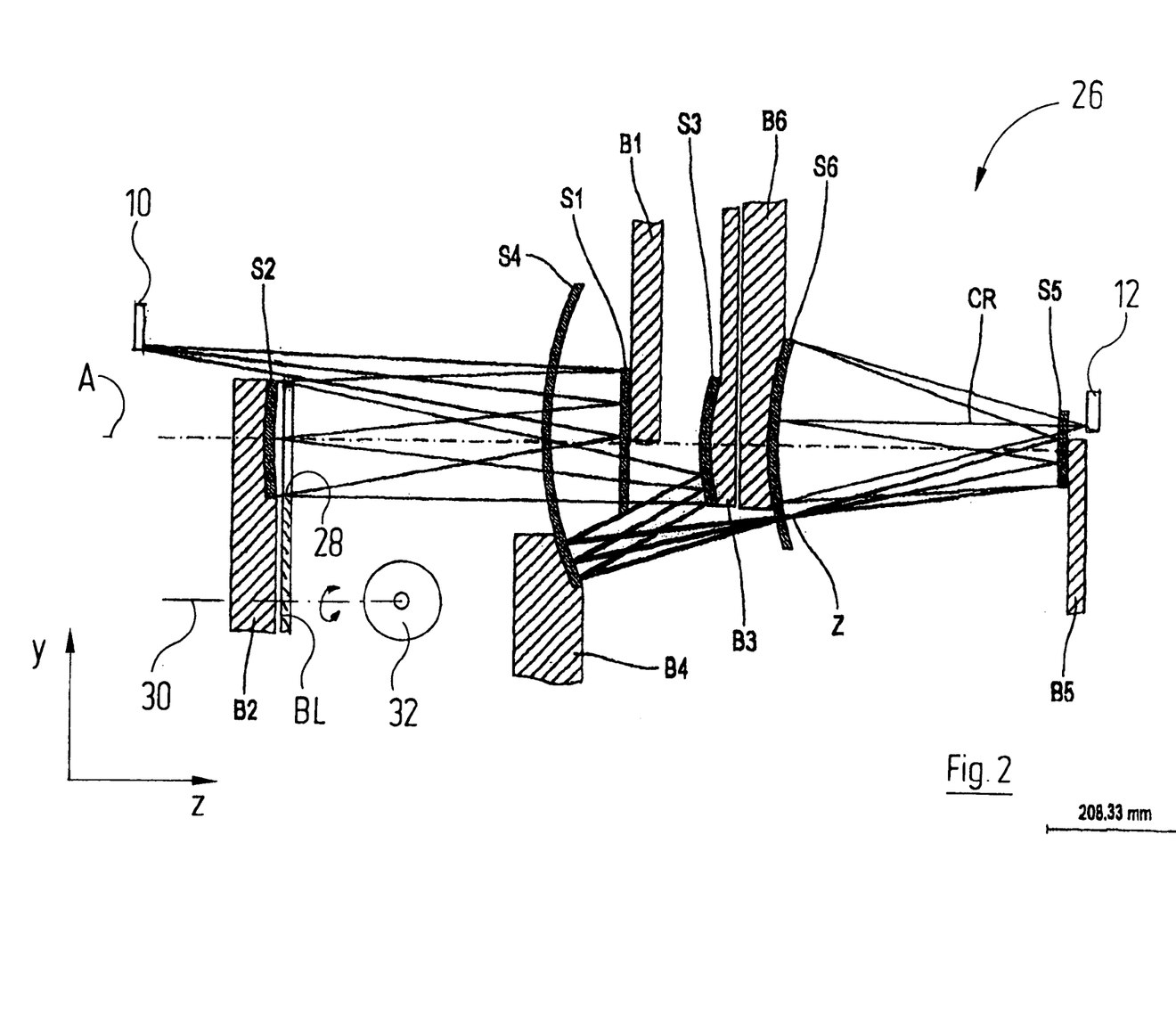
FIG. 2 is a schematic axial sectional view of a projection lens of the projection exposure apparatus according to FIG. 1.

FIG. 2 shows details of the structure of the projection lens 26. The lens 26 comprises six mirrors S1, S2, S3, S4, S5 and S6 as imaging components. The mirror surfaces of said mirrors are arranged coaxially with respect to a common axis A.

The different mirrors S1 to S6 are reproduced in the drawing as rotationally symmetrical elements with respect to axis A. It is self-evident that in reality these mirrors are realized only in the areas actually utilized by the beam path, the other areas not being present. In FIG. 2 these areas are also needed by the remainder of the beam path.

The mirrors S1 to S6 are arranged on respective base elements B1 to B6. In addition to a support function these base elements can also perform further functions, e.g. to provide thermostatic control for the mirrors, and to offer the necessary installation space for such functions.

A diaphragm BL is arranged at a short distance in front of the mirror S2. This diaphragm comprises an aperture 28 which limits the light flux through the projection lens.

The diaphragm BL preferably takes the form of a disc which is rotatable about an axis 30 and can be rotated by means of a stepper motor 32 in order to move one of a plurality of diaphragm apertures 28 in front of the mirror S2.

Instead of a rotary diaphragm BL a diaphragm having a plurality of apertures and displaceable in a linear manner perpendicularly to the projection plane of FIG. 2, or exchangeable diaphragms having only a single aperture 28 and running in a guide, may also be used.

Figure 3:
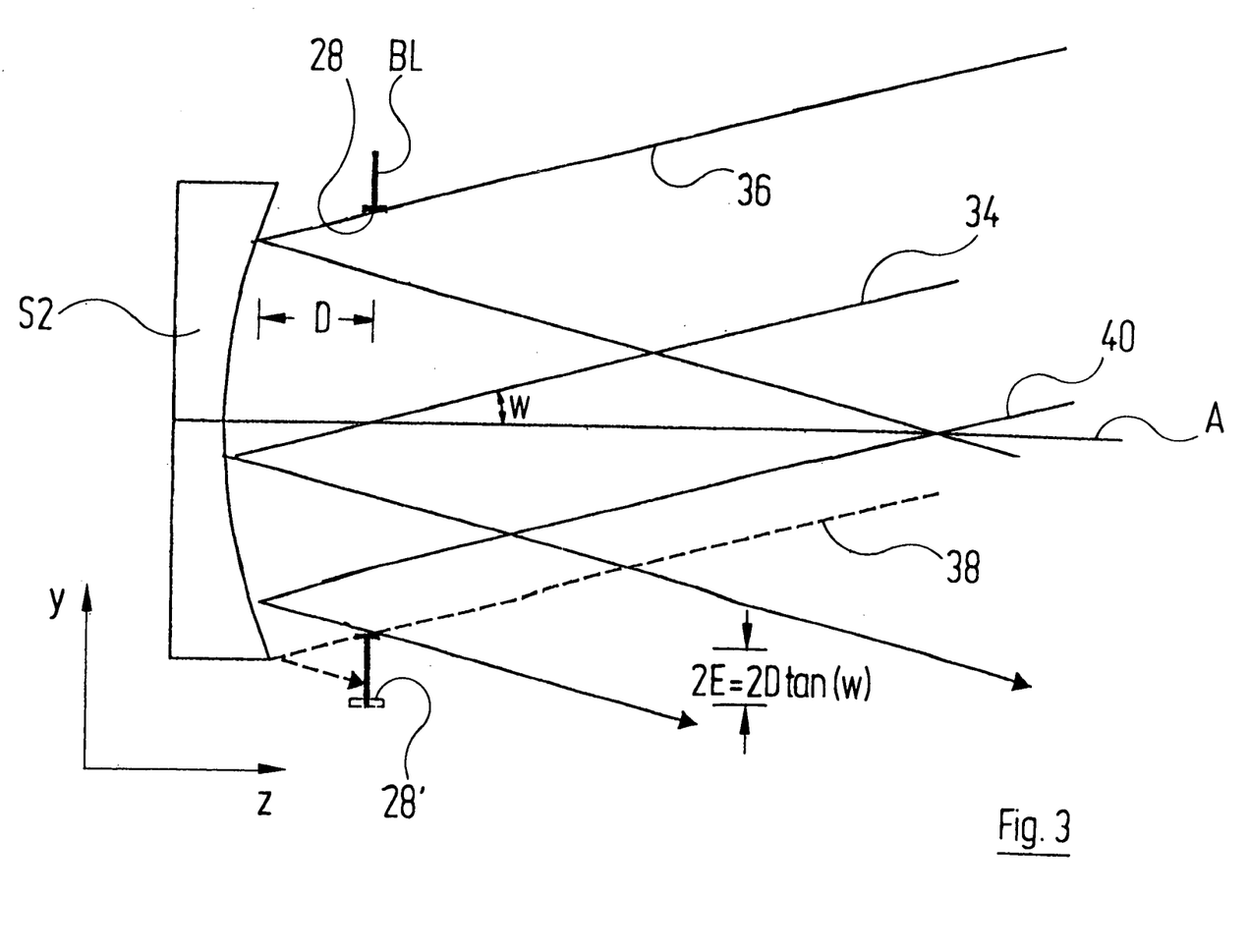
FIG. 3 is a schematic side view of a second mirror of the projection lens according to FIG. 2 and an associated diaphragm.

In FIG. 3 the beam path in the projection lens 28 in the vicinity of the mirror S2 and of the diaphragm BL is drawn on an enlarged scale.

Let it be first assumed that the diaphragm aperture 28 has a circular edge contour.

In FIG. 3 a chief ray 34 can be seen which intersects the plane of the diaphragm BL on the axis A.

In addition, two marginal rays disposed parallel to the chief ray 34, spaced at an equal distance therefrom and leading to the edge of the diaphragm aperture 28 are denoted by numerals 36, 38.

If the diaphragm aperture 28 were formed directly on the concave surface of the mirror S2 the marginal rays 36, 38 would be reflected in like manner by the mirror S2. However, because the diaphragm BL is arranged in a plane located at a distance D in front of the point on the mirror surface located at an equal radius from the optical axis A, the marginal ray 38 is cut off by the rear of the diaphragm BL. The last ray from the bottom parallel to the chief ray 34 in FIG. 3 which can still pass through the diaphragm aperture 28 after reflection by the mirror surface is denoted by numeral 40.

Because of the arrangement of the diaphragm BL at a distance in front of the mirror surface, therefore, a non-symmetrical interception of marginal rays occurs if the diaphragm aperture 28 has a circular edge contour, as is otherwise usual.

The non-symmetrical interception of the marginal rays gives rise to vignetting in the image of the pattern carried by the reticle 10 generated on the wafer 12.

To counteract this effect the diaphragm aperture 28 is provided with a non-round edge contour. This contour is defined, in approximate terms, by calculating for all marginal rays corresponding to a desired diaphragm area the point at which they intersect the plane of the diaphragm BL after reflection by the mirror S2.

This means that the lowest point of the diaphragm aperture 28 in FIG. 3 is moved downwards, as indicated by 28'.

For the other marginal points the necessary lowering is less. If it is assumed that the marginal rays are all at the same distance from the chief ray, these marginal rays together form a cylindrical surface. The diaphragm aperture 28 would therefore have an elliptical edge contour which then has to be extended downwardly as has just been described.

This extended edge contour can be regarded in a simplified manner as an ellipse which has a lengthened main axis and is no longer symmetrical with respect to axis A; its centre point has been displaced downwardly by the distance E from the axis A, if the above-discussed lowering of the lowest point of the diaphragm aperture 28 is defined as 2E.

It can be seen from FIG. 3 that the distance E increases linearly with increasing distance D between the mirror S2 and the diaphragm BL (E=D tan(w)), and that the long axis of the ellipse increases by 1/cos(w) with an increasing angle w between the chief ray 34 and the axis A, while the short axis of the ellipse corresponds to the common distance of the marginal rays from the chief ray.

It follows from the above discussion that the entire edge contour of the diaphragm BL arranged at a distance in front of the mirror is obtained by determining the corresponding adjusted edge contours of the diaphragm aperture for the different directions of chief rays 34 and by superimposing all the edge contours obtained in this way which are possible with the given object field and using their envelope curve as the edge contour for the diaphragm.

This will be explained with reference to FIGS. 4 and 5 with the simplifying condition that for each direction of a chief ray the edge contour of the diaphragm is circular but that the diaphragm aperture is eccentric with respect to the optical axis A.

Figure 4:
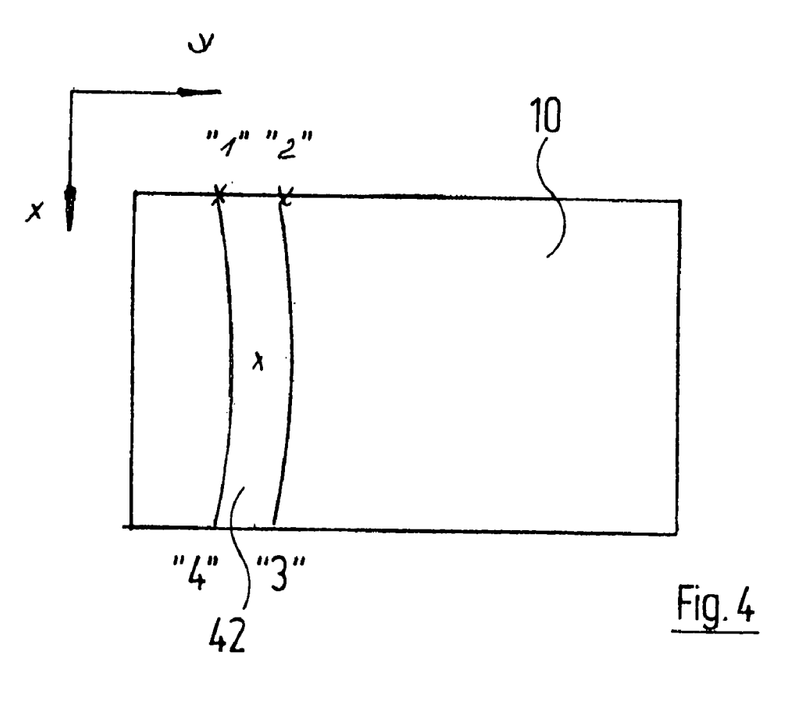
FIG. 4 is a schematic top view of a reticle imaged on a wafer in the projection exposure apparatus of FIG. 1, an object field used for scanning the reticle also being drawn.

In FIG. 4 the light patch produced by the illumination light on the reticle 10 is denoted by numeral 42. The light patch 42 takes the form of a ring segment. For purposes of explanation the radial dimension of the light patch 42 is greatly exaggerated in FIG. 4

In FIG. 4 four object points, denoted by "1", "2", "3" and "4", are marked. They correspond to the corners of the light patch 42.

Figure 5:
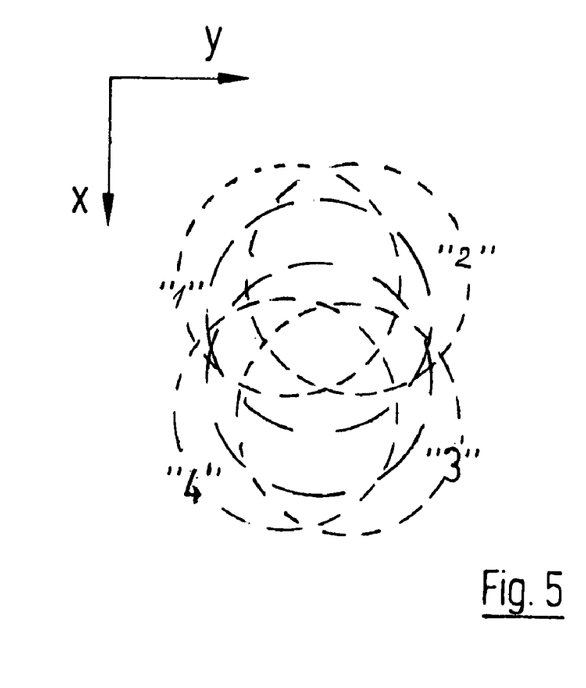
FIG. 5 is a schematic representation of the ideal diaphragm apertures which are obtained for a number of selected illuminated object points on the reticle shown in FIG. 4.

In FIG. 5 the diaphragm aperture edge contours which are obtained for these object points with the circular form assumed above are reproduced.

Figure 6:
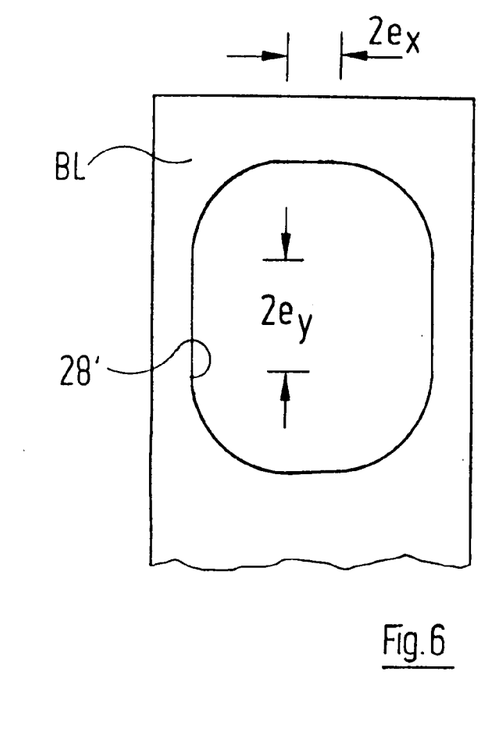
FIG. 6 shows the edge contour of a diaphragm aperture which is the envelope curve of the diaphragm aperture edge contours shown in FIG. 5.

FIG. 6 shows the envelope curve obtained while continuing to respect the different edge contour circles shown in FIG. 5 and the further edge points of the object field 42, which curve generates the modified diaphragm aperture 28'. The distance of the centers of the circles from the transverse centre-line of the diaphragm aperture 28' is denoted by 2ey, and the distance of the centers of the circles from the longitudinal centre-line of the diaphragm aperture 28' by 2ex.

Figure 7:
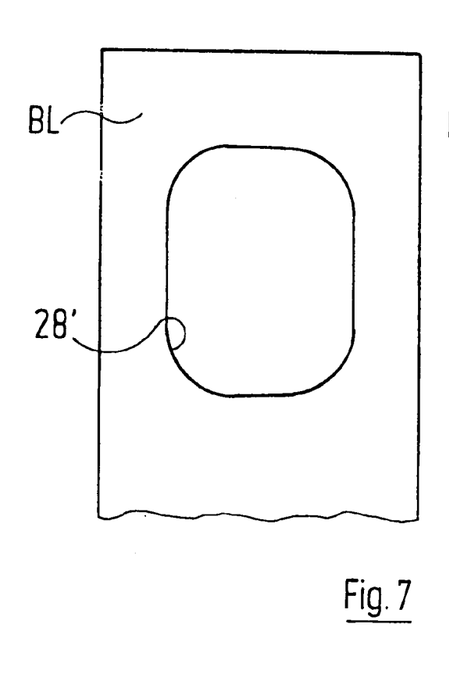
FIG. 7 is a representation similar to that in FIG. 6 in which, however, a diaphragm aperture of smaller cross-section is shown.

FIG. 7 shows similar relationships to those in FIG. 6 except that the radius of each of the individual circles used in the construction according to FIG. 5 has been selected smaller (smaller aperture in the same imaging system).

Figure 8:
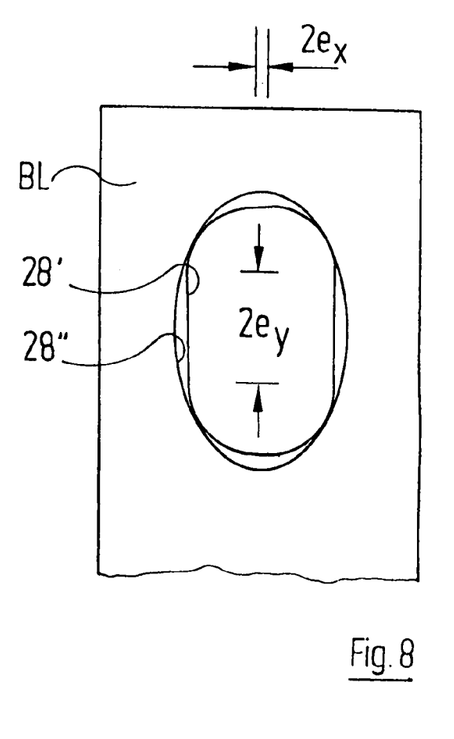
FIG. 8 is a view similar to that in FIG. 7, in which, however, a markedly narrower strip of the object field is used for scanning the reticle.

FIG. 8 shows similar relationships to those in FIG. 7 except that the distance 2ex has been selected markedly smaller, as is the case with the ring-segment-shaped light patches 42 used in practice, which have a small dimension in the direction of scanning. In FIG. 8, in addition to the flattened diaphragm aperture 28', an elliptical diaphragm aperture 28" is drawn, which can be used as an approximation of the flattened form.

In reality, as has been said, ellipses should be imagined instead of circles in FIGS. 5 to 8 since the lines of intersection of the obliquely incident marginal rays of the differently inclined chief rays with the plane of the aperture BL are, considered more precisely, in each case an ellipse and not a circle.

If a smaller or larger diaphragm aperture is required with the above-described projection lens 26 the diaphragm BL can be switched to a different aperture by energizing the stepper motor 32 of a multiplicity of diaphragm apertures distributed at equal distances around the axis of rotation.

In the case of a linearly guided diaphragm BL with a plurality of apertures the diaphragm BL is displaced perpendicularly with respect to the plane of projection of FIG. 2, and if a diaphragm BL with only one aperture is present it can be replaced by another with a different aperture.

Alternatively, a multiplicity of diaphragm plates BL can be stored in a magazine, each of which plates is provided with a multiplicity of diaphragm apertures of different sizes. By means of a controllable changing arrangement operating in a similar manner to a CD-changer a desired aperture can be moved into the beam path in each case.

In this way adjustment of the diaphragm aperture is possible without readjustment of the mirrors S1 to S6. Even if the geometry of the light patch 42 or of the object field is changed, no changes need to be made to the beam path of the projection lens 26. It is sufficient to replace the diaphragm BL by a diaphragm adapted to the new shape of the light patch.

Figure 9:
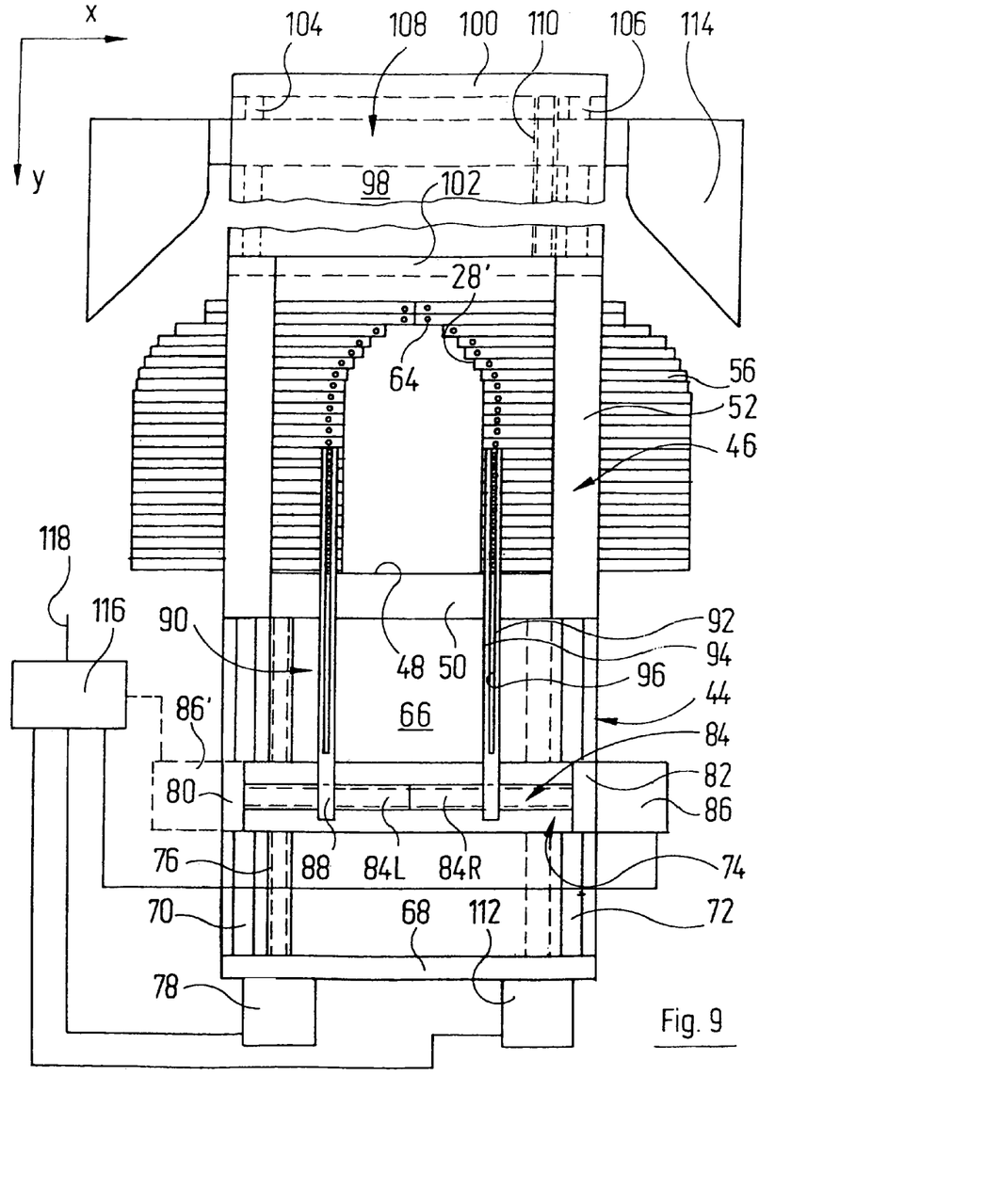
FIG. 9 is an axial top view of an adjustable diaphragm.

FIG. 9 shows a diaphragm BL the aperture geometry of which is adjustable so that very flexible adaptation both of the area of the aperture and of the edge contour of the aperture is possible.

A base-plate 44 carries a frame denoted as a whole by numeral 46 which surrounds a square window 48 in the base-plate 44 in a plane located in front of the latter.

Figure 10:
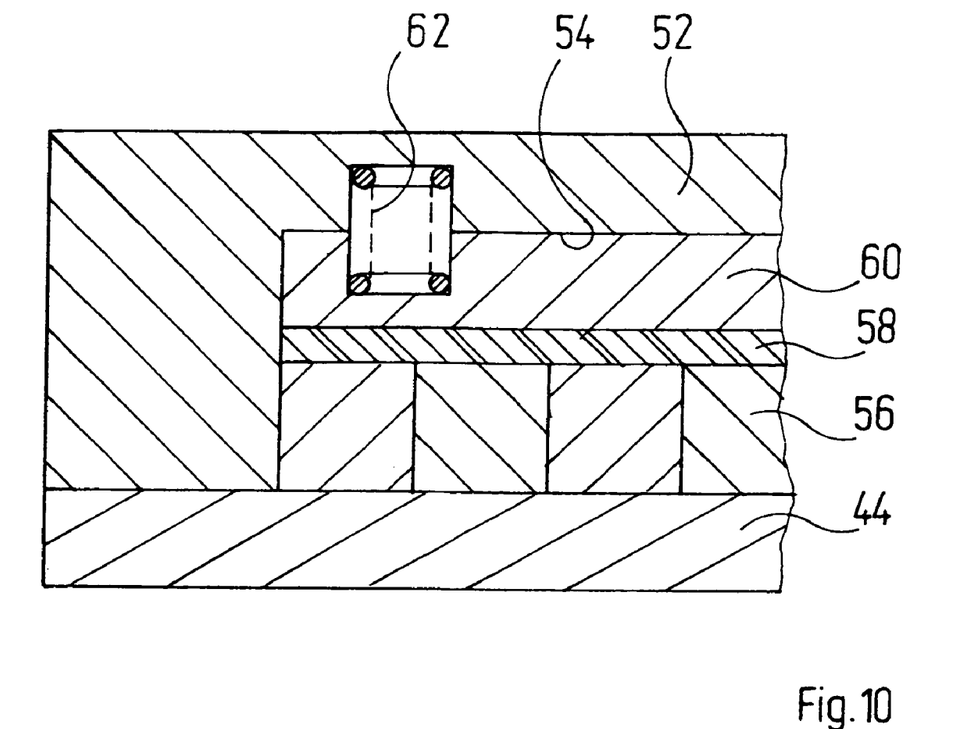
FIG. 10 is an enlarged section through a portion of a diaphragm rod guide mechanism of the adjustable diaphragm according to FIG. 10.
Figure 11:
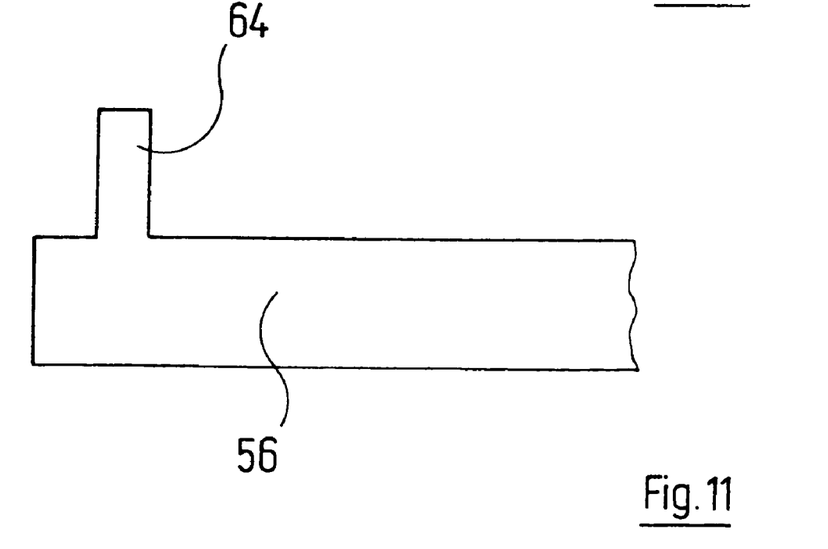
FIG. 11 is a side view of a displaceable diaphragm rod of the adjustable diaphragm of FIG. 9.

The frame 46 comprises two transverse members 50 and two longitudinal members 52. The longitudinal members 52 have in the area of their bounding faces oriented rearwardly in FIG. 9 and located between the transverse members 50 an elongated recess 54, as can be seen in FIG. 10.

A plurality of diaphragm rods 56 with a square cross-section are so fitted into the recess 54 that their total number fits between the end walls of the recess 54 with sliding play.

A friction lining 58 carried by the underside of a pressure plate 60 engages against the flush upper faces of the diaphragm rods 56. Said pressure plate bears by means of springs 62 against the wall of the longitudinal members 52 located above the recess 54.

On their vertical side faces and on their lower bounding faces the diaphragm rods 56 have surface properties which, in conjunction with the surface properties of the base-plate 44, the transverse members 50 and the side faces of the adjacent diaphragm rods, ensure easy movability of the diaphragm rods.

The upper bounding faces of the diaphragm rods 56, by contrast, have a surface quality such that, in cooperation with the underside of the friction lining 58, a braking force is generated which is large enough for the diaphragm rods 56 to retain, under the operating conditions of the projection lens 26a, a longitudinal position once set.

Because the friction lining 58 is somewhat elastic it can absorb small manufacturing tolerances in the dimensions of the diaphragm rods 56.

For adjustment in the horizontal direction in FIG. 9 (x-direction), each of the diaphragm rods 56 carries on its inward end an actuating pin 64. This pin is preferably formed integrally, e.g. by milling away a top layer of the diaphragm rods 56 in all areas except for the fixing pins 64.

The base-plate 44 has a section 66 located below the frame 46 in FIG. 9, at the free end of which section a bearing rail 68 is provided. Attached to this rail are first ends of guide rods 70, 72 the other ends of which are mounted to the end faces of the longitudinal members 52.

Running on the guide rods 70, 72 is a carriage 74 carrying a nut running on a threaded spindle 76 which likewise is journalled in the bearing rail 68 and in the frame 46. The threaded spindle 76 is driven by a stepper motor 78.

The carriage 74 in its turn carries at both ends bearing rails 80, 82 in which a threaded spindle 84 is journalled. This spindle is driven by a stepper motor 86.

The threaded spindle 84 has located on each side of its centre two sections 84L and 84R carrying a left-hand and a right-hand thread respectively.

Running on the spindle sections 84L and 84R are close-fitting nuts which are provided in end portions 88, located downwardly in FIG. 9, of positioning forks denoted in their totality by numeral 90. The end portions 88 have a rectangular transverse cross-section and run with a sliding fit on the upper face of the carriage 74.

The positioning forks 90 have two parallel members 92, 94 between which is defined a guide slot 96. The width of said guide slot 96 is so dimensioned that it can receive the actuating pins 64 of the diaphragm rods 56 with close-fitting play.

A plate section 98 of the diaphragm BL located above the frame 46 in FIG. 9 carries on its bounding face located behind the plane of projection a bearing rail 100, and two guide rods 104, 106 are journalled on the bearing rail 100 and on a bearing rail 102 carried by the rear face of the base plate 44. A carriage 108, also located behind the base plate 44, runs on said guide rods.

The carriage 108 carries a nut co-operating with a threaded spindle 110 which is driven by a further stepper motor 112.

Provided on the bounding face, which is forwardly oriented in FIG. 9, of the carriage 108 are two ramp bodies 114 which extend to the plane of projection of FIG. 9 and further upwardly therefrom to the path of the diaphragm rods 56.

It can be seen that by downward movement of the carriage 108 in FIG. 9, and through cooperation of the ramp bodies 114 with the rear ends of the diaphragm rods 56, the totality of the diaphragm rods can move together inwardly so that no diaphragm aperture is left free. In this way a defined end position for all diaphragm rods 56 is obtained.

The actuating pins 64 of the different diaphragm rods are then in alignment in a similar manner to that shown for the two uppermost diaphragm rods in FIG. 9.

In this initial position of the diaphragm rods the positioning forks 90 which have been moved fully inwards by means of suitable energizing of the stepper motor 86 can now be moved upwardly by energizing of the stepper motor 78 until all the actuating pins 64 have been received by the guide slot 96.

In order now to adjust the diaphragm rods 56 in such a way that a diaphragm aperture with the desired edge contour is obtained the following procedure is adopted:

Starting from the above-described initial position the aperture for the uppermost pair of diaphragm rods is first set by corresponding energizing of the stepper motor 86. The stepper motor 78 is then energized until the positioning forks 96 are moved downwardly in FIG. 9 by the width of one diaphragm rod. As this movement takes place the actuating pins 64 of the uppermost pair of diaphragm rods are released and these diaphragm rods are no longer influenced by subsequent movements of the stepper motor 86.

The corresponding procedure is adopted for the second and third pair of diaphragm rods, etc.

In FIG. 9 a state of adjustment of the diaphragm rods 56 is reproduced in which the positioning forks 96 have already positioned and released the upper half of the diaphragm rods 56. The lower half of the diaphragm rods has still to be positioned. For this purpose a similar procedure as was described above is adopted except that the stepper motor 86 is now energized in each case in such a way that it moves the positioning forks 96 a short distance towards each other, this movement taking place symmetrically with respect to the longitudinal centre plane of the frame 44.

Suitable control of the stepper motors 78 and 86 is effected by a control unit 114 which receives commands from an external control system via a data line 116, which commands specify either the size and contour type of the desired diaphragm aperture (from which the control unit 114 itself calculates the x-coordinates for the individual diaphragm rods and the energizing of the stepper motor 86 necessitated thereby), or already receives the finished reference positions for the diaphragm rods 56.

The control unit 114 also ensures that the positioning of the individual pairs of diaphragm rods and the displacement of the positioning forks 96 take place in successive sub-cycles.

Finally, the control unit 114 also effects the return positioning of all diaphragm rods to their inward end position by corresponding activation of the stepper motor 112, the positioning forks 90 having been previously moved completely downwardly in FIG. 9 and placed out of engagement with all the actuating pins 64.

It should be pointed out that the carriage 108 carrying the ramp bodies 114 is not absolutely necessary. If the diaphragm bodies 56 are relied on to remain securely in the set position through frictional engagement, the reinsertion of the actuating pins 64 in the guide slots 96 can be effected by resetting the guide slots 96 in a cycled manner from below to the positions of the actuating pins 64 known by the control unit 114 and then moving the positioning forks 96 upwardly by one rod division, which is effected by corresponding energizing of the stepper motor 78.

However, the separate return positioning device comprising the carriage 106 and the ramp bodies 112 has the advantage that a defined initial position is re-established in all cases, even if the diaphragm rods 56 have become unintentionally displaced or if the information on the position of the actuating pins 64 has been lost, e.g. through a defect in the control unit 114, failure of mains power supply, etc.

As a modification of the above-described embodiment diaphragm apertures having an edge contour asymmetrical with respect to the centre plane of FIG. 9 can also be produced by making the spindle sections 84L and 84R movable independently of one another and providing a further stepper motor 86' in addition to the stepper motor 86, as indicated by a broken line in FIG. 9.

In practice the diaphragm rods 56 can have a cross-section of 0.5 mm×0.5 mm or 1 mm×1 mm so that a fine gradation of the edge contour of the diaphragm aperture is obtained.

What is claimed is:

1. A projection lens for a microlithographic exposure apparatus, comprising:
   a mirror on which a chief ray of a light bundle falls obliquely with respect to a mirror axis; and
   a diaphragm arranged at a distance in front of the mirror, said diaphragm having a diaphragm aperture with a non-round edge contour for controlling a light flux impinging on and reflected from the mirror, wherein the edge contour of the diaphragm aperture is configured such that two rays of the light bundle disposed symmetrically with respect to the chief ray are treated equally.

2. The projection lens of claim 1, wherein the edge contour of the diaphragm aperture is configured such that either both rays pass through the diaphragm aperture or both are blocked by the diaphragm.

3. A projection lens for a microlithographic exposure apparatus, comprising:
a mirror on which a chief ray of a light bundle falls obliquely with respect to a mirror axis; and
a diaphragm arranged at a distance in front of the mirror, said diaphragm having a diaphragm aperture with a non-round edge contour for controlling a light flux impinging on and reflected from the mirror, wherein the edge contour of the diaphragm aperture depends on an angle included between a direction of the chief ray and the mirror axis.

4. A projection lens for a microlithographic exposure apparatus, comprising:
a mirror on which a chief ray of a light bundle falls obliquely with respect to a mirror axis; and
a diaphragm arranged at a distance in front of the mirror, said diaphragm having a diaphragm aperture with a non-round edge contour for controlling a light flux impinging on and reflected from the mirror, wherein the edge contour of the diaphragm aperture is selected as a function of an edge contour of an illuminated field in an object plane of the projection lens.

5. The projection lens of claim 4, wherein the edge contour of the diaphragm aperture is substantially symmetrical with respect to a scan direction of the projection exposure apparatus.

6. A projection lens of claim 5, wherein the edge contour of the diaphragm aperture is substantially symmetrical with respect to a longitudinal axis of the diaphragm aperture, and wherein the edge contour is at least substantially defined by an envelope curve of two overlapping ellipses.

7. The projection lens of claim 5, wherein the edge contour of the diaphragm aperture is substantially symmetrical with respect to a longitudinal axis of the diaphragm aperture, and wherein the edge contour of the diaphragm aperture is at least substantially an ellipse.

8. A projection lens of claim 4, wherein the edge contour of the diaphragm aperture is substantially symmetrical with respect to a direction perpendicular to a scan direction of the projection exposure apparatus.

9. A projection lens for a microlithographic exposure apparatus, comprising:
a mirror on which a chief ray of a light bundle falls obliquely with respect to a mirror axis; and
a diaphragm arranged at a distance in front of the mirror, said diaphragm having a diaphragm aperture with a non-round edge contour for controlling a light flux impinging on and reflected from the mirror, wherein the diaphragm aperture belongs to a set of diaphragms having different diaphragm apertures, and wherein the projection lens further comprises a changing device for receiving the set of diaphragms, the changing device configured to move a diaphragm having a desired diaphragm aperture into a light beam path.

10. The projection lens of claim 9, wherein at least two diaphragm apertures have different edge contours.

11. The projection lens of claim 9, wherein at least two diaphragm apertures have different areas.

12. A projection lens for a microlithographic exposure apparatus, comprising:
a mirror on which a chief ray of a light bundle falls obliquely with respect to a mirror axis; and
a diaphragm arranged at a distance in front of the mirror, said diaphragm having a diaphragm aperture with a non-round edge contour for controlling a light flux impinging on and reflected from the mirror, wherein the diaphragm is a movable diaphragm with a plurality of different diaphragm apertures.

13. The projection lens of claim 12, wherein at least two diaphragm apertures have different edge contours.

14. The projection lens of claim 12, wherein at least two diaphragm apertures have different areas.

15. A projection lens for a microlithographic exposure apparatus, comprising:
a mirror on which a chief ray of a light bundle falls obliquely with respect to a mirror axis; and
a diaphragm arranged at a distance in front of the mirror, said diaphragm having a diaphragm aperture with a non-round edge contour for controlling a light flux impinging on and reflected from the mirror, wherein the edge contour of the diaphragm aperture is adjustable.

16. The projection lens of claim 15, wherein the diaphragm comprises two sets of diaphragm rods arranged parallel and displaceably with respect to one another on each side of a centre plane.

17. The projection lens of claim 16, wherein the diaphragm rods have a rectangular or square transverse cross-section.

18. A microlithographic exposure apparatus, comprising:
a mirror on which a chief ray of a light bundle falls obliquely with respect to a mirror axis; and
a diaphragm arranged at a distance in front of the mirror, said diaphragm having a diaphragm aperture with a non-round edge contour for controlling a light flux impinging on and reflected from the mirror, wherein the chief ray passes through a point of intersection between the mirror axis and a plane of the diaphragm.

19. A microlithographic exposure apparatus, comprising:
a mirror on which a chief ray of a light bundle falls obliquely with respect to a mirror axis; and
a diaphragm arranged at a distance in front of the mirror, said diaphragm having a diaphragm aperture with a non-round edge contour for controlling a light flux impinging on and reflected from the mirror wherein the diaphragm is in direct optical communication with the mirror, such that no further optical elements are arranged between the mirror and the diaphragm.

20. A microlithographic exposure apparatus, comprising:
a mirror on which a chief ray of a light bundle falls obliquely with respect to a mirror axis; and
a diaphragm arranged at a distance in front of the mirror, said diaphragm having a diaphragm aperture with a non-round edge contour for controlling a light flux impinging on and reflected from the mirror, wherein the mirror is curved.

21. A microlithographic exposure apparatus, comprising:
a mirror on which a chief ray of a light bundle falls obliquely with respect to a mirror axis; and
a diaphragm arranged at a distance in front of the mirror, said diaphragm having a diaphragm aperture with a non-round edge contour for controlling a light flux impinging on and reflected from the mirror, wherein light rays pass through the diaphragm aperture before and after reflection at the mirror.

* * * * *